(12) United States Patent
Luo et al.

(10) Patent No.: US 12,727,208 B2
(45) Date of Patent: Sep. 1, 2026

(54) METHOD FOR FABRICATING SEMICONDUCTOR STRUCTURE HAVING ENHANCED HOLE LINEAR RASHBA SPIN-ORBIT COUPLING EFFECT

(71) Applicant: Institute of Semiconductors, Chinese Academy of Sciences, Beijing (CN)

(72) Inventors: Junwei Luo, Beijing (CN); Jiaxin Xiong, Beijing (CN); Yang Liu, Beijing (CN); Shan Guan, Beijing (CN); Shushen Li, Beijing (CN)

(73) Assignee: Institute of Semiconductors, Chinese Academy of Sciences, Beijing (CN)

( * ) Notice: Subject to any disclaimer, the term of this patent is extended or adjusted under 35 U.S.C. 154(b) by 533 days.

(21) Appl. No.: 18/321,203

(22) Filed: May 22, 2023

(65) Prior Publication Data

US 2023/0395705 A1 Dec. 7, 2023

Related U.S. Application Data

(63) Continuation of application No. PCT/CN2022/074805, filed on Jan. 28, 2022.

(51) Int. Cl.

*H10D 48/00* (2025.01)
*H10D 62/815* (2025.01)
*H10D 62/832* (2025.01)

(52) U.S. Cl.

CPC ....... *H10D 48/383* (2025.01); *H10D 62/8161* (2025.01); *H10D 62/832* (2025.01)

(58) Field of Classification Search

CPC ............ H10D 62/8161; H10D 62/832; H10D 48/3835; H10D 48/385; H10D 62/8162; H10D 62/812–8181; B82Y 10/00; H10P 14/3252; H10P 95/50

See application file for complete search history.

(56) References Cited

U.S. PATENT DOCUMENTS

| | | | | |
|---|---|---|---|---|
| 5,929,462 | A | 7/1999 | The | |
| 2011/0147710 | A1 * | 6/2011 | Dewey | H10D 30/475 257/E21.409 |
| 2022/0005706 | A1 * | 1/2022 | Weeks | H01L 21/3225 |

FOREIGN PATENT DOCUMENTS

| | | | |
|---|---|---|---|
| CN | 102162137 | A | 8/2011 |
| CN | 111108604 | A | 5/2020 |
| WO | 2020243831 | A1 | 12/2020 |

OTHER PUBLICATIONS

International Search Report issued for International application No. PCT/CN2022/074805, mailed Oct. 27, 2022 (29 pages).
Zhang Dong et al., “Theoretical progress of polarized interfaces in semiconductors;” Journal of Physics, vol. 68, No. 16, 2019 (10 pages).
Office Action issued in CN Application No. 202210116157.5 with English translation dated Aug. 23, 2025 (19 pages).

* cited by examiner

*Primary Examiner* — Shahed Ahmed
(74) *Attorney, Agent, or Firm* — Osha Bergman Watanabe & Burton LLP

(57) ABSTRACT

A method for fabricating a semiconductor structure having an enhanced hole linear Rashba spin-orbit coupling effect includes: providing a substrate; and growing a germanium quantum well on the substrate. A silicon atomic layer is inserted at an interface between a well and a barrier of the germanium quantum well. The silicon atomic layer includes one or more monolayers.

17 Claims, 3 Drawing Sheets

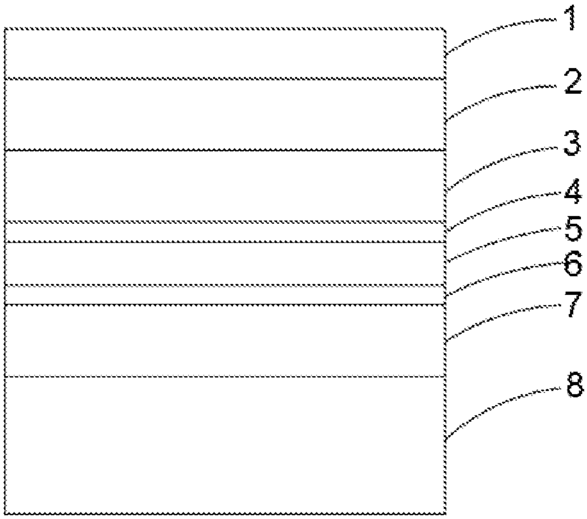
Fig. 1
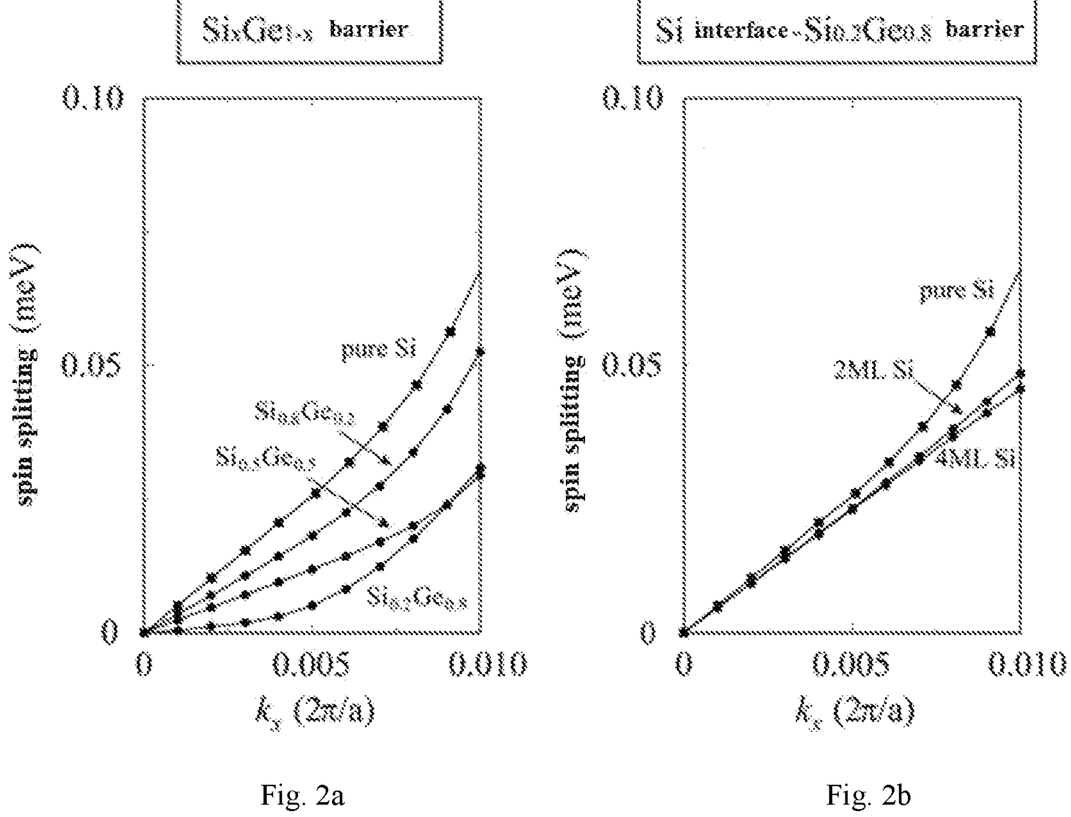
Fig. 2a
Fig. 2b

METHOD FOR FABRICATING SEMICONDUCTOR STRUCTURE HAVING ENHANCED HOLE LINEAR RASHBA SPIN-ORBIT COUPLING EFFECT

CROSS-REFERENCE TO RELATED APPLICATION

This application is a continuation of International Patent Application No. PCT/CN2022/074805 filed on Jan. 28, 2022, the entire contents of which are incorporated herein by reference for all purposes.

FIELD

The present disclosure relates to the field of semiconductor technology, and relates to a method for fabricating a semiconductor structure having an enhanced hole linear Rashba spin-orbit coupling effect.

BACKGROUND

In recent years, it was found in the semiconductor quantum computation field that the spin-orbit coupling effect drives hole spin qubits in gate-defined quantum dots to flip over quickly, which is related to the structure of the semiconductor quantum devices. The spin-orbit coupling effect can be classified into the Rashba effect and Dresselhaus effect. The Rashba effect is caused by the structural inversion asymmetry due to low-dimensional system interfaces and can be tuned by an external electric field. The Dresselhaus effect is caused by the intrinsic bulk inversion asymmetry of a material. The driving force of the fast manipulation of hole qubits is demonstrated to be the linear Rashba spin-orbit coupling effect. Since fastening qubit manipulation is one of the most important requirements for quantum computation, it is rather necessary to provide a method to design a semiconductor structure that would enhance the hole linear Rashba spin-orbit coupling effect.

SUMMARY

In an aspect, the present disclosure provides in embodiments a method for fabricating a semiconductor structure having the enhanced hole linear Rashba spin-orbit coupling effect. The method includes: providing a substrate, and growing a germanium quantum well on the substrate, in which a silicon atomic layer is inserted at an interface between a well and a barrier of the germanium quantum well, in which the silicon atomic layer includes one or more monolayers.

In some embodiments, growing the germanium quantum well on the substrate includes growing a first alloy layer on the substrate, growing a first silicon atomic layer on the first alloy layer, in which the first silicon atomic layer includes one or more monolayers, growing a germanium layer on the first silicon atomic layer, growing a second silicon atomic layer on the germanium layer, in which the second silicon atomic layer includes one or more monolayers, and growing a second alloy layer on the second silicon atomic layer.

In some embodiments, growing the germanium quantum well on the substrate includes growing a first silicon-germanium superlattice on the substrate, in which the first silicon-germanium superlattice includes one or more monolayers of silicon, growing a germanium layer on the first silicon-germanium superlattice, and growing a second silicon-germanium superlattice on the germanium layer, in which the second silicon-germanium superlattice includes one or more monolayers of silicon.

In some embodiments, the method further includes growing a dielectric layer on the germanium quantum well, and growing an electrode on the dielectric layer.

In some embodiments, the substrate is a silicon substrate.

In some embodiments, the germanium layer has a thickness of 10 nm to 20 nm.

In some embodiments, the first alloy layer is a first silicon-germanium alloy layer and the second alloy layer is a second silicon-germanium alloy layer, a composition of silicon in each silicon-germanium alloy layer is between 10% and 50%, and a thickness of each silicon-germanium alloy layer is less than 100 nm.

In some embodiments, the first silicon atomic layer and the second silicon atomic layer both have 1 to 4 monolayers.

In some embodiments, the first silicon-germanium superlattice and the second silicon-germanium superlattice both have a thickness of less than 100 nm, in which the number of monolayers of silicon or germanium ranges from 1 to 4.

In some embodiments, a dielectric material of the dielectric layer is $SiO_2$ or $Al_2O_3$, and a thickness of the dielectric layer is ranging from 10 nm to less than 100 nm.

In some embodiments, the electrode is a metal electrode, a material of the metal electrode is Al or Au, and a thickness of the electrode is in a range of 10 to 100 nm.

In some embodiments, phases of germanium and silicon materials in the germanium quantum well are both crystals having a regular tetrahedral covalent bond.

In some embodiments, the germanium quantum well has a hole concentration of at least $10^{10}$ $cm^{-2}$, and a mobility of at least $10^5$ $cm^2/(V \cdot s)$.

In another aspect, the present disclosure provides in embodiments a semiconductor structure, including a substrate, and a germanium quantum well grown on the substrate, in which a silicon atomic layer is inserted at an interface between a well and a barrier of the germanium quantum well, in which the silicon atomic layer includes one or more monolayers.

In some embodiments, the semiconductor structure includes the substrate, a first alloy layer, a first silicon atomic layer, a germanium layer, a second silicon atomic layer, a second alloy layer, a dielectric layer, and a metal electrode grown sequentially from bottom to top, in which the first silicon atomic layer and the second silicon atomic layer each include one or more monolayers.

In some embodiments, the semiconductor structure includes the substrate, a first silicon-germanium superlattice, a germanium layer, a second silicon-germanium superlattice, a dielectric layer, and a metal electrode grown sequentially from bottom to top, in which the first silicon-germanium superlattice and the second silicon-germanium superlattice each include one or more monolayers of silicon.

In some embodiments, the substrate is a silicon substrate.

In some embodiments, the first alloy layer is a first silicon-germanium alloy layer, the second alloy layer is a second silicon-germanium alloy layer, a composition of silicon in each silicon-germanium alloy layer is between 10% and 50%, and a thickness of each silicon-germanium alloy layer is less than 100 nm.

In some embodiments, the first silicon atomic layer and the second silicon atomic layer both have 1 to 4 monolayers.

In some embodiments, the first silicon-germanium superlattice and the second silicon-germanium superlattice both have a thickness of less than 100 nm, and the number of monolayers of silicon or germanium ranges from 1 to 4.

In some embodiments, phases of germanium and silicon materials in the germanium quantum well are both crystals having a regular tetrahedral covalent bond.

Additional aspects and advantages of the present disclosure will be set forth in the following description, some of which will be apparent from the following description, or learned through the practice of the present disclosure.

BRIEF DESCRIPTION OF THE DRAWINGS

The above and/or additional aspects and advantages of the present disclosure will be apparent and easily understood from the description of the embodiments below with reference to the accompanying drawings.

FIG. 1 is a schematic diagram showing a germanium quantum well according to an embodiment of the present disclosure.

FIG. 2*a* is a graph of a hole spin splitting value versus a wave vector in a germanium quantum well without a silicon atomic layer.

FIG. 2*b* is a graph of a hole spin splitting value versus a wave vector in a germanium quantum well with a silicon atomic layer according to an embodiment of the present disclosure.

DETAILED DESCRIPTION

Figure 3A:
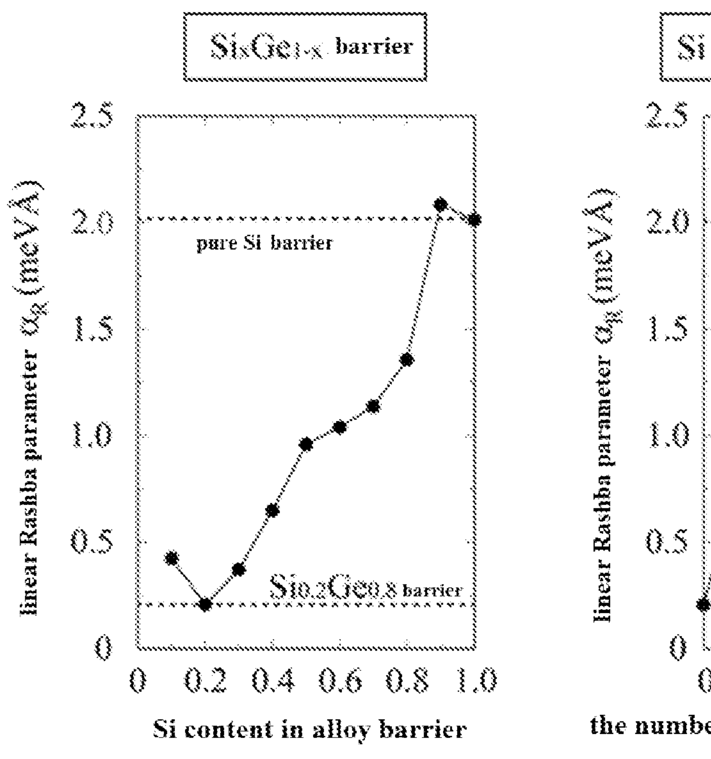
FIG. 3*a* is a graph of a linear Rashba parameter corresponding to a germanium quantum well versus a silicon content of an alloy barrier.

Embodiments of the present disclosure are described in detail below, examples of which are illustrated in the accompanying drawings. The embodiments described below with reference to the accompanying drawings are illustrative, and are intended to explain the present disclosure and cannot be construed as limiting the present disclosure.

An object of the present disclosure is to provide a solution for realizing an enhanced hole linear Rashba spin-orbit coupling strength of a semiconductor germanium quantum well, which is compatible with a microelectronic CMOS process, so as to solve a problem that a hole linear Rashba effect of a quantum well is unobservable in experiments and further improve the manipulation rate of hole spin qubits in gate-defined quantum dots.

Accordingly, the present disclosure provides a method for enhancing the hole linear Rashba spin-orbit coupling effect by using an interface of a germanium quantum well which is deeply compatible with a CMOS process. With this method, the Rashba strength will be improved by an order of magnitude, contributing to rapid control of spin qubits in quantum computing.

Group IV elements such as germanium and silicon have a long spin decoherence time due to their weak nuclear spin scattering and an ability to further reduce the influence of nuclear spin through an isotope purification technology. Germanium holes have a strong spin-orbit coupling effect and are not affected by valley degeneracy and valley scattering. On the other hand, experience has been accumulated for the microelectronic process for the germanium material, and thus realizing compatible hole spin qubits of enhanced rate of spin manipulation is desirable. The inventors of present disclosure found that high-quality spin qubits require a fast spin control rate, and the control rate of the spin qubits can be improved by the hole linear Rashba strength.

The concept of the present disclosure is to improve the quantum well structure design by inserting one or more silicon monolayers at the interface between the well and barrier of the traditional germanium quantum well, so as to greatly enhance the hole linear Rashba effect. Germanium quantum well electronic structures of silicon-germanium alloy barriers having different compositions are calculated by using a first-principles empirical pseudopotential method. It is found that the linear Rashba parameter decreases with reducing the silicon composition in the alloy barrier. For a silicon-germanium alloy barrier with 20% silicon component, the hole linear Rashba parameter of the silicon-germanium alloy barrier is only about one tenth of that of the pure silicon barrier (neglecting lattice mismatch at first). It is found that, by inserting one or more silicon monolayers at the interface between the well and the barrier, the linear Rashba parameter will increase to about ten times that of $Si_{0.2}Ge_{0.8}$ alloy barrier, which is close to the linear Rashba parameter of the pure silicon barrier.

In a further embodiment of the present disclosure, a silicon-germanium superlattice barrier is provided to replace the silicon-germanium alloy barrier. Since the germanium quantum well with the pure silicon barrier suffers from lattice mismatch and is difficult to grow in a real experimental situation, the interface engineering embodiment of enhancing the linear Rashba effect of the holes in quantum wells provided by the present disclosure has a strong realistic basis and significant demand guidance.

The present disclosure provides in embodiments the enhanced hole linear Rashba effect at the interface of the germanium quantum well, which is compatible with the existing mature microelectronic CMOS process, and is beneficial to realize the rapid control of spin qubits by using the enhanced Rashba effect. The present disclosure provides interface engineering and superlattice barrier processes, and the germanium quantum well may grow in the [110] direction to have an improved Rashba effect.

The present disclosure will be further described in detail in combination with embodiments and with reference to the accompanying drawings to make the purpose, technical solutions and advantages of the present disclosure more clear.

As shown in FIG. 1, an embodiment of the present disclosure provides a method for enhancing the hole linear Rashba spin-orbit coupling effect by using an interface of a germanium quantum well, which involves a key step as follows. One or more silicon monolayers are inserted at the interface between the well and barrier of the germanium quantum well, in which the silicon atomic layers include one or more monolayers.

A method for fabricating the germanium quantum well includes steps S1 to S7.

In S1, a first silicon-germanium alloy layer 7 is grown on a silicon substrate 8 to reduce lattice mismatch between germanium and silicon, in which a content of silicon in the first silicon-germanium alloy layer 7 is between 10% and 50%, and a thickness of the first silicon-germanium alloy layer 7 is several tens of nanometers.

In S2, a first silicon atomic layer 6 is grown epitaxially or deposited on the first silicon-germanium alloy layer 7, in which the first silicon atomic layer 6 includes 1 to 4 monolayers.

In S3, a germanium layer 5 is grown on the first silicon atomic layer 6, in which a thickness of the germanium layer 5 is ranging from about 10 nanometers to 20 nanometers.

In S4, a second silicon atomic layer 4 is grown epitaxially or deposited on the germanium layer 5, in which the second silicon atomic layer 4 includes 1 to 4 monolayers.

In S5, a second silicon-germanium alloy layer 3 is grown on the second silicon atomic layer 4, in which a content of silicon in the second silicon-germanium alloy layer 3 is between 10% and 50%, and a thickness of the second silicon-germanium alloy layer 3 is about several tens of nanometers.

In S6, a dielectric layer 2 is grown on the second silicon-germanium alloy layer 3, in which a dielectric material of the dielectric layer 2 may be $SiO_2$ or $Al_2O_3$, and a thickness of the dielectric layer 2 is between ten nanometers and several tens of nanometers.

In S7, a metal electrode 1 is prepared on the dielectric layer 2, in which a material of the metal electrode 1 may be Al or Au, and a thickness of the metal electrode 1 is in the order of several tens of nanometers. The Rashba spin-orbit coupling effect is generated and regulated by a gate voltage applied by the metal electrode 1.

Figure 3B:
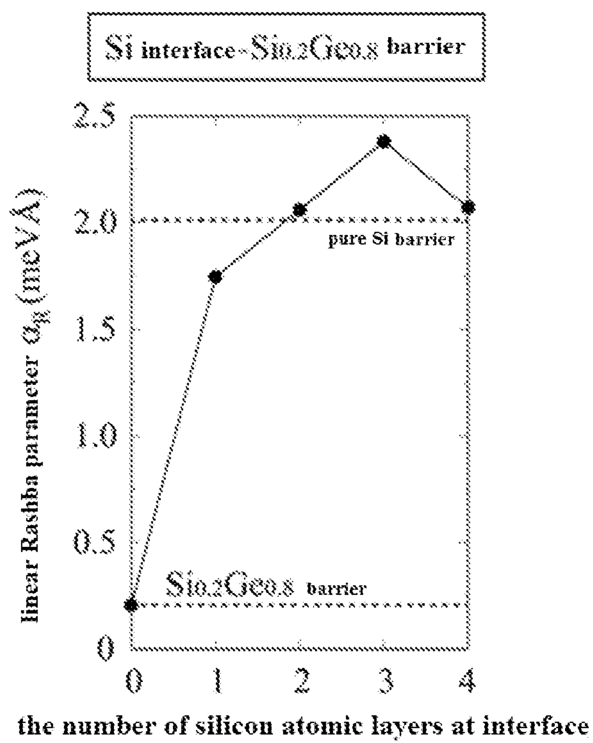
FIG. 3*b* is a graph of a linear Rashba parameter corresponding to a germanium quantum well versus the number of silicon monolayers at an interface.

In an embodiment of the present disclosure, a thickness of the germanium layer in the germanium quantum well is 16 nm, a vertical electric field with a strength of 30 kV/cm is applied, that is, a quantum confinement effect is in a direction perpendicular to a plane, and a biaxial compressive strain of the germanium quantum well caused by the silicon substrate is 0.6%. FIGS. 2*a* and 2*b* are graphs of a hole spin splitting value versus a wave vector in a germanium quantum well according to embodiments of the present disclosure. FIG. 3*a* is the graph of the linear Rashba parameter corresponding to the germanium quantum well versus the silicon content of the alloy barrier, and FIG. 3*b* is the graph of the linear Rashba parameter corresponding to the germanium quantum well versus the number of silicon atomic layers at the interface according to embodiments of the present disclosure. The linear Rashba parameters $\alpha_R$ obtained in FIGS. 3*a* and 3*b* may be obtained from heavy hole spin splitting $\Delta ESS=2\alpha_R k\|$ in an area near a center of a Brillouin zone shown in FIGS. 2*a* and 2*b*, and the linear Rashba parameter may be used to represent the strength of Rashba effect. FIGS. 2*a* and 3*a* illustrate the linear Rashba effect without the silicon atomic layer at the interface. The linear Rashba parameter is 0.21 meVÅ when the content of silicon in the alloy barrier is 20%. The linear Rashba parameter is 0.96 meVÅ when the content of silicon in the alloy barrier is 50%. The linear Rashba parameter is 1.36 meVÅ when the content of silicon in the alloy barrier is 80%. For pure silicon barrier, the linear Rashba parameter is 2.01 meVÅ. Calculation results of FIGS. 2*a* and 3*a* show that the linear Rashba parameter gradually increases with the increase of the content of silicon in the alloy barrier.

In a real situation, the composition of silicon in the alloy barrier is between 10% and 50%, usually about 20% to reduce the lattice mismatch between silicon and germanium. In the embodiments of the present disclosure, one or more silicon atomic layers are inserted into the interface of the germanium quantum well of $Si_{0.2}Ge_{0.8}$ alloy barrier, and the results of corresponding spin splitting values and the linear Rashba parameters are shown in FIGS. 2*b* and 3*b*. The figures show that the linear Rashba parameters obtained by inserting one, two and four silicon atomic layers are 1.75 meVÅ, 2.06 meVÅ and 2.07 meVÅ, respectively, which are close to the linear Rashba parameter value of the pure silicon barrier in the ideal case. Compared with the linear Rashba parameter of the germanium quantum well without the silicon atom layer inserted at the interface, the parameters obtained by the present method are larger by an order of magnitude.

Figure 4:
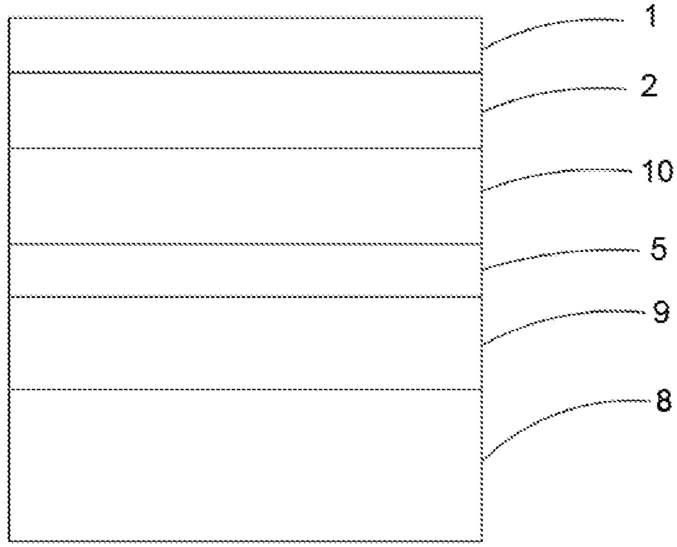
FIG. 4 is a schematic diagram showing a germanium quantum well with a silicon-germanium superlattice barrier according to an embodiment of the present disclosure.

As shown in FIG. 4, the present disclosure provides a further embodiment based on the above-mentioned embodiment. That is, the silicon-germanium alloy barrier is replaced with the silicon-germanium superlattice barrier, but one or more silicon atomic layers are still guaranteed at an interface of the germanium well.

A method for fabricating the germanium quantum well includes steps S1 to S5.

In S1, a first silicon-germanium superlattice 9 is grown epitaxially or deposited on the silicon substrate 8, in which the number n of monolayers of silicon or germanium in the first silicon-germanium superlattice $(Si)_n/(Ge)_n$ ranges from 1 to 4, and a thickness of the first silicon-germanium superlattice 9 is about several tens of nanometers.

In S2, a germanium layer 5 is grown on the first silicon-germanium superlattice 9, in which a thickness of the germanium layer 5 is about 10 nanometers to 20 nanometers.

In S3, a second silicon-germanium superlattice 10 is grown epitaxially or deposited on the germanium layer 5, in which the number n of monolayers of silicon or germanium in the second silicon-germanium superlattice $(Si)_n/(Ge)_n$ ranges from 1 to 4, and a thickness of the second silicon-germanium superlattice 10 is about several tens of nanometers.

In S4, a dielectric layer 2 is grown on the second silicon-germanium superlattice 10, in which a dielectric material of the dielectric layer 2 may be $SiO_2$ or $Al_2O_3$, and a thickness of the dielectric layer 2 is between ten nanometers and several tens of nanometers.

In S5, a metal electrode 1 is prepared on the dielectric layer 2, in which a material of the metal electrode 1 may be Al or Au, and a thickness of the metal electrode 1 is in the order of several tens of nanometers. The Rashba spin-orbit coupling effect is generated and regulated by a gate voltage applied by the metal electrode 1.

Figure 5:
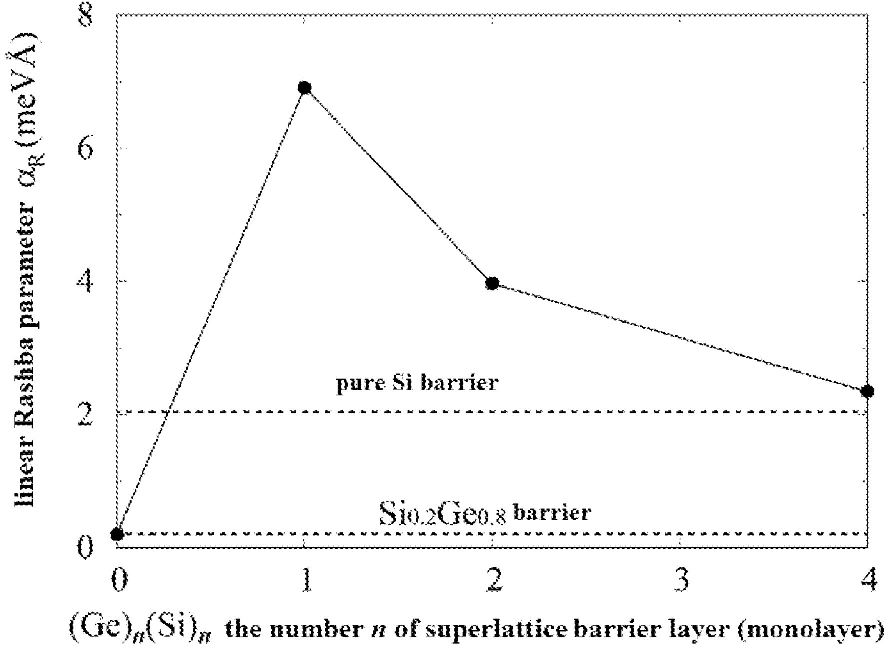
FIG. 5 is a graph of a linear Rashba parameter versus the number of monolayers of silicon or germanium in the silicon-germanium superlattice of FIG. 4.

In an embodiment of the present disclosure, a thickness of the germanium layer in the germanium quantum well is 16 nm, a vertical electric field with a strength of 30 kV/cm is applied, that is, a quantum confinement effect is in a direction perpendicular to a plane, and a biaxial compressive strain of the germanium quantum well caused by the silicon substrate is 0.6%. FIG. 5 is a graph of a linear Rashba parameter versus the number of atomic layers of silicon or germanium in the silicon-germanium superlattice according to a further embodiment of the present disclosure. For germanium quantum wells with superlattice barriers of $(Si)_1/(Ge)_1$, $(Si)_2/(Ge)_2$, and $(Si)_4/(Ge)_4$, corresponding linear Rashba parameters are 6.91 meVÅ, 3.97 meVÅ, and 2.35 meVÅ, respectively, which are all larger than the linear Rashba parameter of the germanium quantum well with the pure silicon barrier, and also two to three times larger than the linear Rashba parameter of the interface-alloy barrier system in the embodiments of the present disclosure described above. FIG. 5 shows that the linear Rashba parameter decreases with the increase of the number of atomic layers of silicon and germanium in the silicon-germanium superlattice. Therefore, the linear Rashba effect of the germanium quantum well with the superlattice barrier of $(Si)_1/(Ge)_1$ shows the maximum of the linear Rashba effect, and is about 30 times higher than that of the existing germanium quantum well with the alloy barrier of $Si_{0.2}Ge_{0.8}$ but without an interface silicon atomic layer.

Two-dimensional gate-defined germanium quantum dots grown based on germanium quantum wells may be used for quantum computing, and qubits thereof refer to spin at a lowest energy level of holes in the quantum dots. A control rate of the spin qubits is proportional to the linear Rashba effect, so the solution for enhancing the linear Rashba effect at the interface of the germanium quantum well provided by the present disclosure may improve the control rate of the spin qubits.

To sum up, the present disclosure provides the method for enhancing the hole linear Rashba spin-orbit coupling effect by using the interface of germanium quantum well. The method is compatible with the CMOS process, and one or more silicon atomic layers are inserted at the interface on the basis of the traditional germanium quantum well structure, which may obtain an order of magnitude improvement of the hole linear Rashba spin splitting value and improve the control rate of the spin qubits of the two-dimensional gate-defined germanium quantum dots.

In some embodiments, the substrate may be, but not limited to, a silicon substrate.

In some embodiments, the silicon-germanium superlattice $(Si)_n/(Ge)_n$ may also be $(Ge)_m/(Si)_n$, that is, the number of germanium monolayers can be different from the number of silicon monolayers, i.e., m≠n, and the corresponding effects may still be obtained. That is, the technical effect described in the present disclosure may be achieved as long as there is at least one silicon atomic layer at the interface.

In some embodiments, phases of germanium and silicon materials in the germanium quantum well are both crystals having a regular tetrahedral covalent bond.

In some embodiments, the silicon atomic layer is grown on the silicon-germanium alloy layer by molecular beam epitaxy or vapor deposition method.

In some embodiments, the germanium quantum well has a hole concentration of at least $10^{10}$ $cm^{-2}$, and a mobility of at least $10^5$ $cm^2/(V \cdot s)$.

Another embodiment of the present disclosure provides a semiconductor structure. As shown in FIG. 1, the semiconductor structure includes a silicon substrate 8, and a germanium quantum well grown on the silicon substrate 8, in which a silicon atomic layer is inserted at an interface between a well and a barrier of the germanium quantum well. The semiconductor structure includes a silicon substrate 8, a first silicon-germanium alloy layer 7, a first silicon atomic layer 6, a germanium layer 5, a second silicon atomic layer 4, a second silicon-germanium alloy layer 3, a dielectric layer 2, and a metal electrode 1 grown sequentially from bottom to top. The first silicon atomic layer 6 and the second silicon atomic layer 4 each include 1 to 4 monolayers. A content of silicon in each silicon-germanium alloy layer is between 10% and 50%, and a thickness of each silicon-germanium alloy layer is several tens of nanometers. Phases of germanium and silicon materials in the germanium quantum well are both crystals having a regular tetrahedral covalent bond. The germanium layer has a thickness of 10 nm to 20 nm. A dielectric material of the dielectric layer is $SiO_2$ or $Al_2O_3$, and a thickness of the dielectric layer is between ten nanometers and several tens of nanometers. A material of the metal electrode 1 is Al or Au, and a thickness of the metal electrode 1 is in the order of several tens of nanometers.

A further embodiment of the semiconductor structure is provided. As shown in FIG. 4, the semiconductor structure includes a silicon substrate 8, a first silicon-germanium superlattice 9, a germanium layer 5, a second silicon-germanium superlattice 10, a dielectric layer 2 and a metal electrode 1 grown sequentially from bottom to top. The first silicon-germanium superlattice 9 and the second silicon-germanium superlattice 10 each include 1 to 4 monolayers of silicon or germanium. A thickness of the first silicon-germanium superlattice 9 and a thickness of the second silicon-germanium superlattice 10 are both several tens of nanometers. Phases of germanium and silicon materials in the germanium quantum well are both crystals having a regular tetrahedral covalent bond. The germanium layer 5 has a thickness of 10 nm to 20 nm. A dielectric material of the dielectric layer 2 is $SiO_2$ or $Al_2O_3$, and a thickness of the dielectric layer 2 is between ten nanometers and several tens of nanometers. A material of the metal electrode 1 is Al or Au, and a thickness of the metal electrode 1 is in the order of several tens of nanometers.

In some embodiments, both the first silicon-germanium superlattice 9 and the second silicon-germanium superlattice 10 include at least one monolayer of silicon.

All the embodiments of the present disclosure may be executed separately, or in combination with other embodiments, which are within the protection scope of the present disclosure.

Terms such as “first” and “second” are used herein for purposes of description and are not intended to indicate or imply relative importance or significance or to imply the number of indicated technical features. Thus, the feature defined with “first” and “second” may explicitly or implicitly include at least one of these features. In the description of the present disclosure, “a plurality of” means at least two, such as two, three, etc., unless specified otherwise.

Reference throughout this specification to “an embodiment”, “some embodiments”, “an example”, “a specific example”, or “some examples”, mean that a particular feature, structure, material, or characteristic described in connection with the embodiment or example is included in at least one embodiment or example of the present disclosure. The schematic expressions of the above-mentioned terms throughout this specification are not necessarily referring to the same embodiment or example. Moreover, the particular features, structures, materials, or characteristics described may be combined in any suitable manner in one or more embodiments or examples. In addition, those skilled in the art can combine the different embodiments or examples and features of different embodiments or examples described in this specification without being mutually inconsistent.

Although the embodiments of the present disclosure have been shown and described above, it is to be understood that the above embodiments are illustrative and cannot be construed as limiting the present disclosure, and those skilled in the art may make changes, modifications, substitutions, and variations to the above embodiments within the scope of the present disclosure.

What is claimed is:

1. A method for fabricating a semiconductor structure having an enhanced hole linear Rashba spin-orbit coupling effect, comprising:

providing a substrate; and growing a germanium quantum well on the substrate, wherein a silicon atomic layer is inserted at an interface between a well and a barrier of the germanium quantum well, wherein the silicon atomic layer comprises one or more monolayers;

wherein growing the germanium quantum well on the substrate comprises:

growing a first alloy layer on the substrate;

growing a first silicon atomic layer on the first alloy layer, wherein the first silicon atomic layer comprises one or more monolayers;

growing a germanium layer on the first silicon atomic layer;

growing a second silicon atomic layer on the germanium layer, wherein the second silicon atomic layer comprises one or more monolayers; and growing a second alloy layer on the second silicon atomic layer;

the methods further comprises:

growing a dielectric layer on the germanium quantum well; and growing a metal electrode on the dielectric layer.

2. The method of claim 1, wherein growing the germanium quantum well on the substrate comprises:

growing a first silicon-germanium superlattice on the substrate, wherein the first silicon-germanium superlattice includes one or more monolayers of silicon;

growing a germanium layer on the first silicon-germanium superlattice; and growing a second silicon-germanium superlattice on the germanium layer, wherein the second silicon-germanium superlattice includes one or more monolayers of silicon.

3. The method of claim 1, wherein the substrate is a silicon substrate.

4. The method of claim 1, wherein the germanium layer has a thickness of 10 nm to 20 nm.

5. The method of claim 2, wherein the germanium layer has a thickness of 10 nm to 20 nm.

6. The method of claim 1, wherein the first alloy layer is a first silicon-germanium alloy layer and the second alloy layer is a second silicon-germanium alloy layer, a composition of silicon in each silicon-germanium alloy layer is between 10% and 50%, and a thickness of each silicon-germanium alloy layer is less than 100 nm.

7. The method of claim 1, wherein the first silicon atomic layer and the second silicon atomic layer both have 1 to 4 monolayers.

8. The method of claim 2, wherein the first silicon-germanium superlattice and the second silicon-germanium superlattice both have a thickness of less than 100 nm, wherein the number of monolayers of silicon or germanium ranges from 1 to 4.

9. The method of claim 1, wherein a dielectric material of the dielectric layer is $SiO_2$ or $Al_2O_3$, and a thickness of the dielectric layer is ranging from 10 nm to less than 100 nm.

10. The method of claim 1, wherein the electrode is a metal electrode, a material of the metal electrode is Al or Au, and a thickness of the electrode is in a range of 10 to 100 nm.

11. The method of claim 1, wherein phases of germanium and silicon materials in the germanium quantum well are both crystals having a regular tetrahedral covalent bond.

12. The method of claim 1, wherein the germanium quantum well has a hole concentration of at least $10^{10}$ $cm^{-2}$, and a mobility of at least $10^5$ $cm^2/(V \cdot s)$.

13. A semiconductor structure, comprising:

a substrate; and a germanium quantum well grown on the substrate, wherein a silicon atomic layer is inserted at an interface between a well and a barrier of the germanium quantum well, wherein the silicon atomic layer comprises one or more monolayers;

further comprising the substrate, a first alloy layer, a first silicon atomic layer, a germanium layer, a second silicon atomic layer, a second alloy layer, a dielectric layer, and a metal electrode grown sequentially from bottom to top, wherein the first silicon atomic layer and the second silicon atomic layer each comprise one or more monolayers.

14. The semiconductor structure of claim 13, comprising the substrate, a first silicon-germanium superlattice, a germanium layer, a second silicon-germanium superlattice, a dielectric layer, and a metal electrode grown sequentially from bottom to top, wherein the first silicon-germanium superlattice and the second silicon-germanium superlattice each comprise one or more monolayers of silicon.

15. The semiconductor structure of claim 4, wherein the first alloy layer is a first silicon-germanium alloy layer, the second alloy layer is a second silicon-germanium alloy layer, a composition of silicon in each silicon-germanium alloy layer is between 10% and 50%, and a thickness of each silicon-germanium alloy layer is less than 100 nm.

16. The semiconductor structure of claim 4, wherein the first silicon atomic layer and the second silicon atomic layer both have 1 to 4 monolayers.

17. The semiconductor structure of claim 14, wherein the first silicon-germanium superlattice and the second silicon-germanium superlattice both have a thickness of less than 100 nm, wherein the number of monolayers of silicon or germanium ranges from 1 to 4.

* * * * *